(12) United States Patent
Guo et al.

(10) Patent No.: US 10,790,153 B2
(45) Date of Patent: Sep. 29, 2020

(54) METHODS AND APPARATUS FOR ELECTRON BEAM ETCHING PROCESS

(71) Applicant: Applied Materials, Inc., Santa Clara, CA (US)

(72) Inventors: Yue Guo, Redwood City, CA (US); Yang Yang, San Diego, CA (US); Kartik Ramaswamy, San Jose, CA (US); Kenneth S. Collins, San Jose, CA (US); Steven Lane, Porterville, CA (US); Gonzalo Monroy, San Francisco, CA (US); Lucy Zhiping Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/391,263

(22) Filed: Apr. 22, 2019

(65) Prior Publication Data
US 2020/0006036 A1 Jan. 2, 2020

Related U.S. Application Data

(60) Provisional application No. 62/692,219, filed on Jun. 29, 2018.

(51) Int. Cl.
| | | |
|---|---|---|
| *H01L 21/3065* | (2006.01) | |
| *H01J 37/305* | (2006.01) | |
| *H01J 37/32* | (2006.01) | |
| *H01L 21/3213* | (2006.01) | |

(52) U.S. Cl.
CPC ...... *H01L 21/3065* (2013.01); *H01J 37/3053* (2013.01); *H01J 37/321* (2013.01); *H01J 37/3255* (2013.01); *H01J 37/3266* (2013.01); *H01J 37/32082* (2013.01); *H01J 37/32091* (2013.01); *H01J 37/32137* (2013.01); *H01J 37/32697* (2013.01); *H01L 21/32136* (2013.01); *H01J 2237/152* (2013.01); *H01J 2237/3151* (2013.01); *H01J 2237/3341* (2013.01)

(58) Field of Classification Search
None
See application file for complete search history.

(56) References Cited

U.S. PATENT DOCUMENTS

| | | |
|---|---|---|
| 7,569,484 B2 | 8/2009 | Rueger et al. |
| 7,879,730 B2 | 2/2011 | Naser-Ghodsi et al. |
| 9,023,666 B2 | 5/2015 | Auth et al. |
| 2009/0288603 A1 | 11/2009 | Rueger et al. |
| 2016/0020068 A1 | 1/2016 | Martin et al. |

(Continued)

*Primary Examiner* — Jiong-Ping Lu
(74) *Attorney, Agent, or Firm* — Patterson + Sheridan, LLP (57) ABSTRACT

Embodiments described herein relate to apparatus and methods for performing electron beam etching process. In one embodiment, a method of etching a substrate includes delivering a process gas to a process volume of a process chamber, applying a RF power to an electrode formed from a high secondary electron emission coefficient material disposed in the process volume, generating a plasma comprising ions in the process volume, bombarding the electrode with the ions to cause the electrode to emit electrons and form an electron beam, applying a negative DC power to the electrode, accelerating electrons emitted from the bombarded electrode toward a substrate disposed in the process chamber, and etching the substrate with the accelerated ions.

15 Claims, 8 Drawing Sheets

(56) References Cited

U.S. PATENT DOCUMENTS

2016/0020114 A1* 1/2016 Metz ................ H01L 21/31116
  438/710
2016/0276134 A1* 9/2016 Collins ............. H01J 37/32357

* cited by examiner

METHODS AND APPARATUS FOR ELECTRON BEAM ETCHING PROCESS

CROSS-REFERENCE TO RELATED APPLICATIONS

This application claims benefit of U.S. Provisional Application Ser. No. 62/692,219 filed Jun. 29, 2018, which is incorporated by reference in its entirety.

BACKGROUND

Field

Embodiments of the present disclosure generally relate to methods and apparatus for etching a substrate. More specifically, embodiments described herein relate to methods and apparatus for electron beam etching.

Description of the Related Art

In the semiconductor manufacturing industry, various technological advances have enabled production of increasingly complex devices at advanced technology nodes. For example, device feature sizes have been reduced to the nanometer scale and the geometric complexity of such features has grown increasingly complex. Etching processes used to fabricate such devices are often a limiting factor in further development of advanced devices.

Reactive ion etching (RIE) is a conventional etching technique which utilizes ion bombardment to induce etching reactions on a substrate. With RIE, anisotropic etching profiles may be generated and obtained. However, certain ion energy thresholds are often necessary to induce desired etching reactions and to control the etching profile. The ion energy thresholds often reduce etch selectivity and may damage the structure being etched.

Electron beams are another technology used in the semiconductor manufacturing industry. Electrons beams, when utilized with suitable etching gas chemistries, can induce etching on a substrate. However, conventional electron beam etching apparatus typically emit an electron beam with a cross section on the micrometer scale, which is not practical for high volume production of advanced semiconductor devices.

Thus, there is a need in the art for improved etching apparatus and methods.

SUMMARY

Embodiments described herein relate to apparatus and methods for performing electron beam etching process. In one embodiment, a method of etching a substrate includes delivering a process gas to a process volume of a process chamber, applying a RF power to an electrode formed from a high secondary electron emission coefficient material disposed in the process volume, generating a plasma comprising ions in the process volume, bombarding the electrode with the ions to cause the electrode to emit electrons and form an electron beam, applying a negative DC power to the electrode, accelerating electrons emitted from the bombarded electrode toward a substrate disposed in the process chamber, and etching the substrate with the accelerated ions.

In another embodiment, a method of etching a substrate includes delivering a process gas to a process volume of a process chamber, applying a RF power to an electrode formed from a high secondary electron emission coefficient material disposed in the process volume, generating a plasma comprising ions in the process volume, bombarding the electrode with the ions to cause the electrode to emit electrons and form an electron beam, generating a magnetic field in the process volume of the process chamber, altering a trajectory of the electrons in the process volume, and etching a substrate with an incident angle relative to a horizontal surface of the substrate.

In yet another embodiment, a substrate processing apparatus includes a chamber body having a ceiling, sidewalls and a bottom defining an interior volume, a pedestal disposed in the interior volume, an electrode coupled to the ceiling facing the pedestal in the interior volume, a DC voltage supply coupled to the ceiling of the chamber body, and a RF power generator coupled to the ceiling of the chamber body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus and methods for performing electron beam etching process. In one embodiment, an apparatus for performing an electron beam etching processes comprises a capacitive coupled plasma generator or an inductive coupled plasma generator. The apparatus may further include a coil assembly that may provide a magnetic field, either horizontally or vertically, while generating electron beam in the apparatus. In another embodiment, the apparatus for performing an electron beam etching processes comprises a DC voltage power source coupled to the apparatus so as to generate a DC power to the apparatus as needed. The DC power as generated may enhance the energy of the electron beam. The apparatus has an electrode formed from a material having a high secondary electron emission coefficient, which may help generating electron beams during process. The electrons are accelerated toward a substrate to induce etching, either directional or non-directional, of the substrate.

Figure 1:
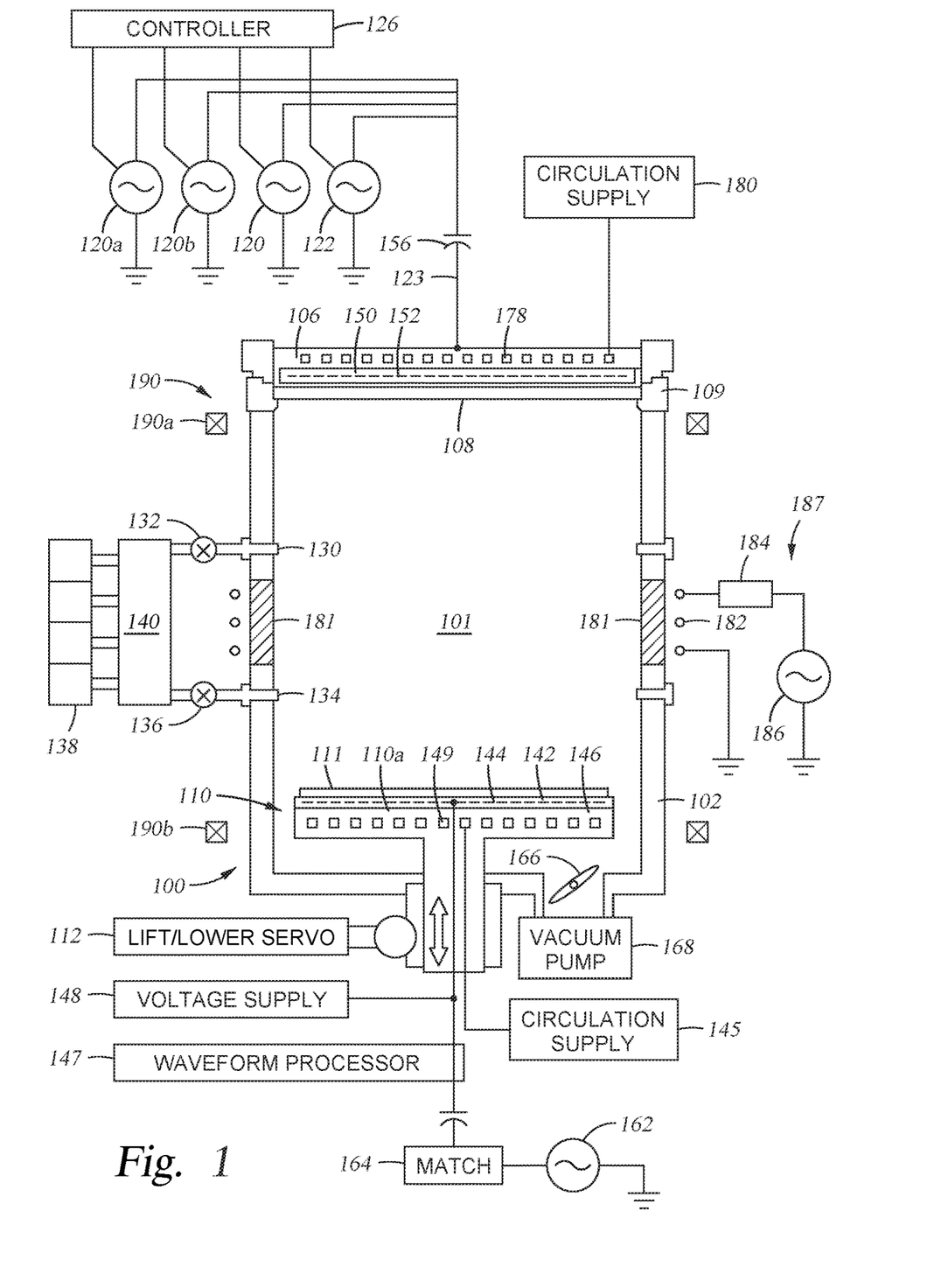
FIG. 1 schematically illustrates one example of an electron beam reactive etching apparatus according to an embodiment described herein.

FIG. 1 schematically illustrates an electron beam etching chamber 100. The chamber 100 has a chamber body 102 which defines a process volume 101. In one embodiment, the chamber body 102 has a substantially cylindrical shape. In other embodiments, the chamber body 102 has a polygonal shape, such as a cubic shape or the like. The chamber body 102 is fabricated from a material suitable for maintaining a vacuum pressure environment therein, such as metallic materials, for example aluminum or stainless steel.

A ceiling 106 is coupled to the chamber body 102 and further defines the process volume 101. In one embodiment, the ceiling 106 is formed from an electrically conductive material, such as the materials utilized to fabricate the chamber body 102. The ceiling 106 is coupled to and supports an electrode 108 thereon. In one embodiment, the electrode 108 is coupled to the ceiling 106 such that the electrode 108 is disposed adjacent the process volume 101. In one embodiment, the electrode 108 is formed from a process-compatible material having a high secondary electron emission coefficient, such as silicon, carbon, silicon carbon materials, or silicon-oxide materials. Alternatively, the electrode 108 is formed from a metal oxide material such as aluminum oxide, yttrium oxide, or zirconium oxide. A dielectric ring 109, which is formed from an electrically insulating material, is coupled to the chamber body 102 and surrounds the electrode 108. As illustrated, the dielectric ring 109 is disposed between the chamber body 102 and the ceiling 106 and supports the electrode 108 thereon.

A pedestal 110 is disposed in the process volume 101. The pedestal 110 supports a substrate 111 thereon and has a substrate support surface 110a oriented parallel to the electrode 108. In one embodiment, the pedestal 110 is movable in the axial direction by a lift mechanism 112. During operation, a substrate support surface 110a is maintained at a distance of between about 1 inch and about 30 inches from the top electrode 108. In one embodiment, the pedestal 110 includes an insulating puck 142 which forms the substrate support surface 110a, an electrode 144 disposed inside the insulating puck 142, and a chucking voltage supply 148 connected to the electrode 144. Additionally, a base layer 146 underlying the insulating puck 142 has internal passages 149 for circulating a thermal transfer medium (e.g., a liquid) from a circulation supply 145. In one embodiment, the circulation supply 145 functions as a heat sink. In another embodiment, the circulation supply 145 functions as a heat source. In one embodiment, a temperature of the pedestal 110 is maintained between about −20° C. and about 1000° C.

An RF power generator 120 (such as a RF source power) having a high frequency (greater than 60 MHz, such as 160 MHz) and a lower frequency RF power generator 122 (such as RF source power having a frequency less than 60 MHz, such as 2 MHz) having a frequency below the VHF range or below the HF range are coupled to the electrode 108 via an RF feed conductor 123. Output power levels of the RF power generators 120, 122 are independently controlled by a controller 126. As will be described in detail below, power from the RF power generators 120, 122 is coupled to the electrode 108.

In one embodiment, the ceiling 106 is electrically conductive and is in electrical contact with the electrode 108. Power, such as a RF source power, from the RF power generators 120, 122 is conducted through the ceiling 106 to the electrode 108. In one embodiment, the chamber body 102 is maintained at ground potential. In one embodiment, grounded internal surfaces (i.e. chamber body 102) inside the chamber 100 are coated with a process compatible material such as silicon, carbon, silicon carbon materials, or silicon-oxide materials. In an alternative embodiment, grounded internal surfaces inside the chamber 100 are coated with a material such as aluminum oxide, yttrium oxide, or zirconium oxide.

In one embodiment, the RF power generators 120, 122 may be replaced by two high frequency power generators 120a and 120b or vice versa (e.g., two low RF frequency power) that are separately controlled. The controller 126 governs plasma ion density by selecting the ratio between the output power levels of the power generators 120a and 120b.

With the power generators 120, 122, radial plasma uniformity in the process volume 101 can be controlled by selecting a distance between the electrode 108 and pedestal 110. In one example, the lower frequency produces an edge-high radial distribution of plasma ion density in the process volume 101 and the upper frequency produces a center-high radial distribution of plasma ion density. With a proper selection, the power levels from the power generators 120, 122 are capable of generating a plasma with a substantially uniform radial plasma ion density.

In one embodiment, a side window 181 is formed in the chamber body 102. The side window 181 is formed from a material (e.g., quartz or aluminum oxide/nitride) through which RF power may be inductively coupled. A coil assembly 187 is disposed adjacent to the side window 181. The coil assembly 187 includes an inductive coil antenna 182 surrounding the side window 181 and the inductive coil antenna 182 is driven by an RF power generator 186 through an impedance match current 184. By utilizing the inductive coil antenna 182, a plasma density in the process volume 101 may be substantially enhanced by the RF power from the RF power generator 186. In one example, the RF power generator 186 and the coil antenna 182 may assist providing a bombardment power to sputter off materials from the electrode 108, thus assisting generating secondary electrons to form electron beam to the substrate 111 disposed on the pedestal 110.

In one embodiment, a magnet assembly 190 surrounds the chamber 100. In one embodiment, the magnet assembly 190 comprises a pair of magnets 190a, 190b adjacent an upper portion and a lower portion of the chamber 100 respectively. In one embodiment, the pair of magnets 190a, 190b provides an axial magnetic field suitable for confining an electron beam that is propagating from the upper portion to the lower portion of the chamber 100.

In one embodiment, flow of energetic electrons to the substrate 111 is enhanced and controlled by a magnetic field generated by the magnet assembly 190. This magnetic field may be produced by one of the magnets 190a or 190b, or by another magnet or set of magnets. The magnets 190a, 190b generate the magnetic field in order to confine the electron beam. The magnets 190a or 190b may comprise permanent magnets, electromagnets or other similar devices that are able to generate magnetic field and shape the generated fields in the process volume 101. The magnetic field as generated assists confining the electrons with a desired directionality. The controlled directionality of the electrons may reduce the diverging effect from electron collisions or other non-vertical electric field interference, thus assisting confine the trajectory of the electrons in the processing chamber 100.

In one embodiment, the ceiling 106 is a support for the electrode 108 and includes an insulating layer 150 containing a chucking electrode 152 facing the electrode 108. A D.C. blocking capacitor 156 is connected in series with the power generators 120, 122. In one embodiment, the RF feed conductor 123 is connected to the electrode support or ceiling 106 or other suitable chamber components as needed. In such an embodiment, RF power from the RF feed conductor 123 is capacitively coupled from the chucking electrode 152 to the electrode 108.

In one embodiment, internal passages 178 for conducting a thermally conductive liquid or media inside the ceiling 106 are connected to a thermal media circulation supply 180. The thermal media circulation supply 180 acts as a heat sink or a heat source as needed. The mechanical contact between the electrode 108 and the ceiling 106 is sufficient to maintain high thermal conductance between the electrode 108 and the ceiling 106. In the embodiment of FIG. 1, the force of the mechanical contact is regulated by the electrostatic clamping force applied to the chucking electrode 152.

In one embodiment, upper gas injectors 130 provide process gas into the process volume 101 through a first valve 132. In one embodiment, lower gas injectors 134 provide process gas into the process volume 101 through a second valve 136. The upper gas injectors 130 and the lower gas injectors 134 are disposed in sidewalls of the chamber body 102. Gas is supplied from an array of process gas supplies 138 through an array of valves 140 which may include the first and second valves 132 and 136. In one embodiment, gas species and gas flow rates delivered into the process volume 101 are independently controllable. For example, gas flow through the upper gas injectors 130 may be different from gas flow through the lower gas injectors 134. The controller 126 governs the array of valves 140 to control the gas flow into the processing chamber 100.

In one embodiment, an inert gas, such as argon or helium, is supplied into the process volume 101 through the upper gas injectors 130 and a process gas is supplied into the process volume 101 through the lower gas injectors 134 or vice versa. In this embodiment, the inert gas delivered to the process volume 101 adjacent the electrode 108 functions to buffer the electrode 108 from a reactive plasma formed in the process volume 101, thus increasing the useful life of the electrode 108. In another embodiment, process gas is supplied to the process volume 101 through both the upper gas injectors 130 and the lower gas injectors 134.

In one embodiment, plasma is generated in the process volume 101 by various bulk and surface processes, for example, by capacitive coupling. In one embodiment, plasma generation is also facilitated by energetic ion bombardment of the interior surface of the top electron-emitting electrode 108. In one embodiment, bias power applied to the electrode 108 is between about 1 KW and about 10 KW with a frequency of between about 400 kHz and about 200 MHz. It is believed that ions generated by a capacitively coupled plasma are influenced by an electric field that encourages bombardment of the electrode 108 by the ions generated from the plasma.

The ion bombardment energy of the electrode 108 and the plasma density are functions of both RF power generators 120 and 122. The ion bombardment energy of the electrode 108 is substantially controlled by the lower frequency power from the RF power generator 122 and the plasma density in the process volume 101 is substantially controlled (enhanced) by the VHF power from the RF power generator 120. It is believed that ion bombardment of the electrode 108 causes the electrode to emit secondary electrons. Energetic secondary electrons, which have a negative charge, are emitted from the interior surface of the electrode 108 and accelerated away from the electrode due to the negative bias of the electrode 108.

The flux of energetic electrons from the emitting surface of the electrode 108 is believed to be an electron beam, and may be oriented substantially perpendicular to the interior surface of the electrode 108. A beam energy of the electron beam is approximately equal to the ion bombardment energy of the electrode 108, which typically can range from about 10 eV to 20,000 eV. In one embodiment, the plasma potential is greater than the potential of the electrode 108 and the energetic secondary electrons emitted from the electrode 108 are further accelerated by a sheath voltage of the plasma as the secondary electrons traverse through the plasma.

At least a portion of the electron beam, comprised of the secondary electron flux emitted from electrode 108 due to energetic ion bombardment of the electrode surface, propagates through the process volume 101 and reacts with process gases near the substrate 111. With utilization of suitable process gases, such as chlorine containing materials, fluorine containing materials, bromine containing materials, oxygen containing materials, and the like, the electron beam induces etching reactions on the substrate 111. It is believed that the electron beams, in addition to the capacitively generated plasma, generate chemically reactive radicals and ions which adsorb to the surface of the substrate and form a chemically reactive polymer layer of the surface of the substrate 111. The electron beam bombardment of the chemically reactive polymer layer causes generation of volatile products which results in etching (material removal) of the substrate 111.

Accordingly, the electron beam induces chemical reactions to liberate gas phase volatile products and etch the substrate 111. Etching of the substrate 111 is also influenced by other factors, such as pressure. In one embodiment, a pressure maintained in the process volume 101 during electron beam etching of the substrate 111 is between about 0.001 Torr and about 10 Torr. The pressure is generated by a vacuum pump 168 which is in fluid communication with the process volume 101. The pressure is regulated by a gate valve which is disposed between the process volume 101 and the vacuum pump 168.

In one embodiment, an RF bias power generator 162 is coupled through an impedance match 164 to the electrode 144 of the pedestal 110. In a further embodiment, a waveform tailoring processor 147 may be connected between the output of the impedance match 164 and the electrode 144. The waveform tailoring processor 147 changes the waveform produced by the RF bias power generator 162 to a desired waveform. The ion energy of plasma near the substrate 111 is controlled by the waveform tailoring processor 147. In one embodiment, the waveform tailoring processor 147 produces a waveform in which the amplitude is held during a certain portion of each RF cycle at a level corresponding to a desired ion energy level. The controller 126 controls the waveform tailoring processor 147.

Figure 2:
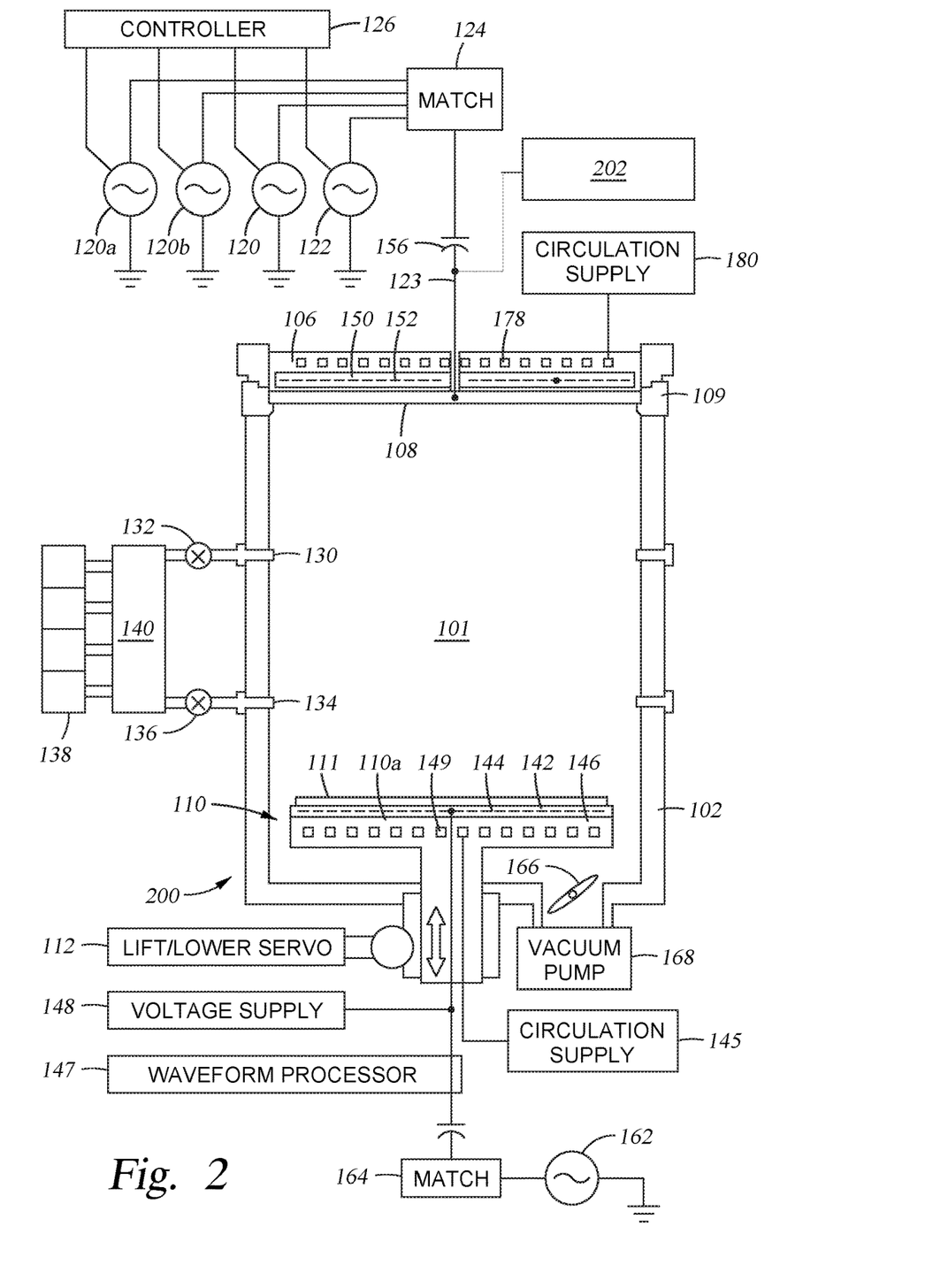
FIG. 2 schematically illustrates another example of an electron beam reactive etching apparatus according to an embodiment described herein.

FIG. 2 depicts another example of an electron beam etching chamber 200. In the embodiment of FIG. 1, the magnet assembly 190 and the inductive coil antenna 182 are utilized enhance and confine the trajectory of the electron beams generated from the RF power generators 120, 122 at a desired level and location. In the embodiment of FIG. 2, instead of the magnet assembly 190 and the inductive coil antenna 182, a DC voltage generator 202 may be coupled to the processing chamber 200. The DC voltage generator 202 may supply a DC voltage power to the electrode 108. In one example, the DC voltage generator 202 may provide a negative DC voltage to the electrode 108. When applying the negative voltage from the DC voltage generator 202, the negative DC voltage may increase the ion bombardment energy and further enhance the second electron emission from the electrode 108. By utilizing the negative DC voltage supplied from the DC voltage generator 202, the frequency of the RF power generator 120, 122 supplied to the electrode 108 may be extended to a higher frequency range as needed, such as above 60 MHz, for example about 60 MHz, 120 MHz and 162 MHz. In such embodiment, RF power generator 120, 122 supplied to generate RF power is predominately utilized to generate plasma in the processing chamber 200 while the negative DC power supplied from the DC voltage generator 202 may assist accelerating the secondary electrons toward the substrate 111 so as to efficiently induce an etching process on the surface of the substrate 111. It is believed that the negative DC power from the DC voltage generator 202 combined with the RF power from the RF power generator 120, 122 may increase the sheath voltage generated on the top electrode 108, which may assist the flux of the secondary electrons as generated so as to enhance the etching performance on the substrate 111.

In one example, the plasma generated from the RF power generators 120, 122 may have a density on the order of $10^{11}$ cm$^{-3}$. In the embodiment wherein a relatively lower energy level of the RF power generator 120, 122 are used, such as about 2 kWatts for a RF frequency of about 2 MHz, also at a relatively low RF frequency range, a DC voltage power from the DC voltage generator 202 may be eliminated and, thus, the electron beam distribution may be maintained at an energy level of about 10 eV to about 3 keV. In contrast, in the embodiment wherein a high RF frequency of above 16 MHz is utilized, such as greater than 162 MHz, a negative DC voltage power of about 3 keV is used to accelerate ions and electrons. Under such condition, the negative DC voltage from the DC voltage generator 202 and the RF power from the RF power generators 120, 122 may be alternatively pulsed to the processing chamber 200.

Figure 5:
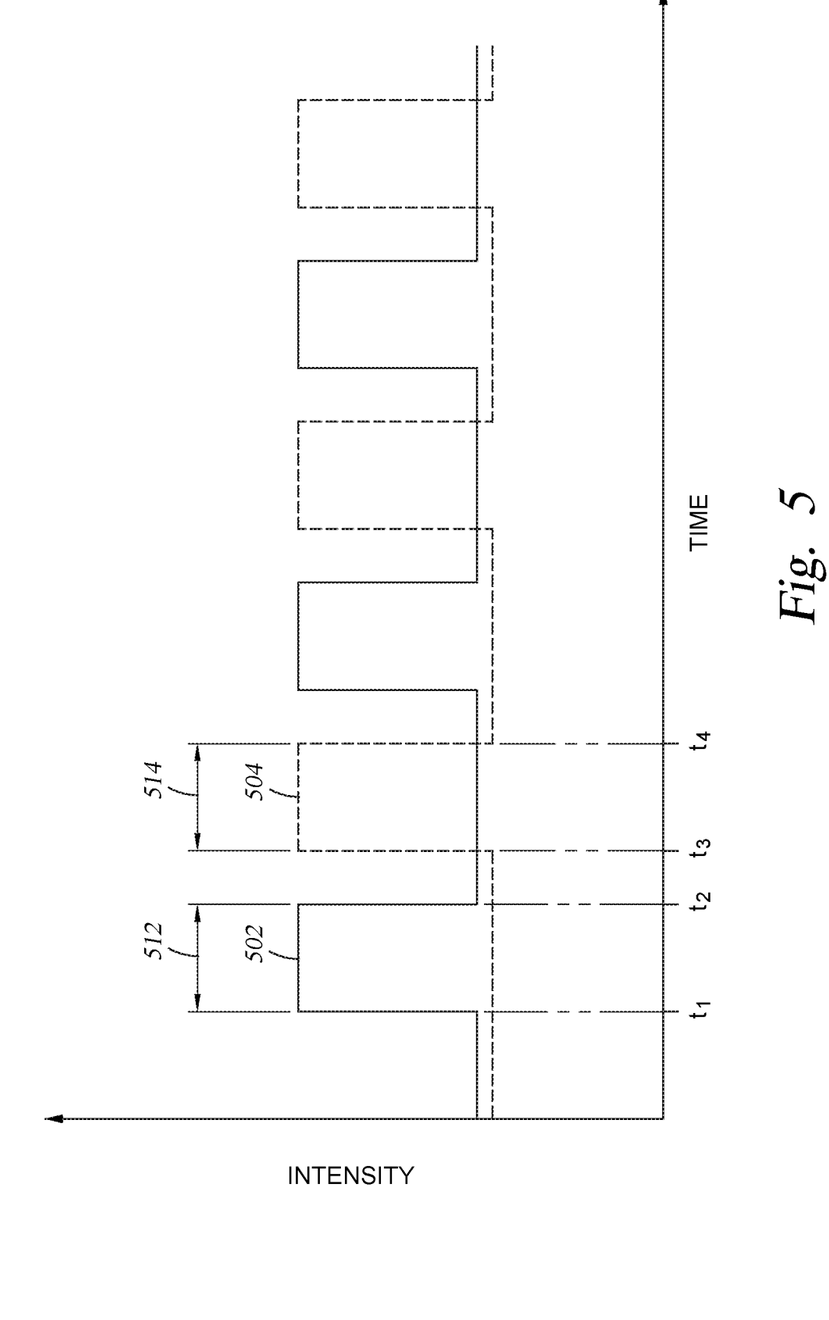
FIG. 5 illustrates a power supplying mode plotted by a function of time according to an embodiment described herein

Referring now to FIG. 5, FIG. 5 depicts a power intensity supplied to the processing chamber 200 plotted as a function of time. The trace line 502 depicts the power intensity supplied from the RF power generator 120, 122 while the trance line 504 depicts the power intensity supplied from the DC voltage generator 202. The power from the RF power generators 120, 122 and the DC voltage generator 202 are alternatively pulsed to the processing chamber 200 for a predetermined time period 512, 514 respectively. Thus, after the plasma is generated from the RF power generators 120, 122, the negative DC power as generated may assist accelerating the electrons, ions, and other species in the plasma toward the substrate surface. The electron beam energy is distributed continuously but with different momentum of the enhanced electron beam energy. By controlling the pulse time periods and power intensities from the RF power generators 120, 122 and the DC voltage generator 202, different electron beam distribution, energy, and trajectory may be obtained so as to control the etching profile, etching selectivity and etching directionality.

Figure 3:
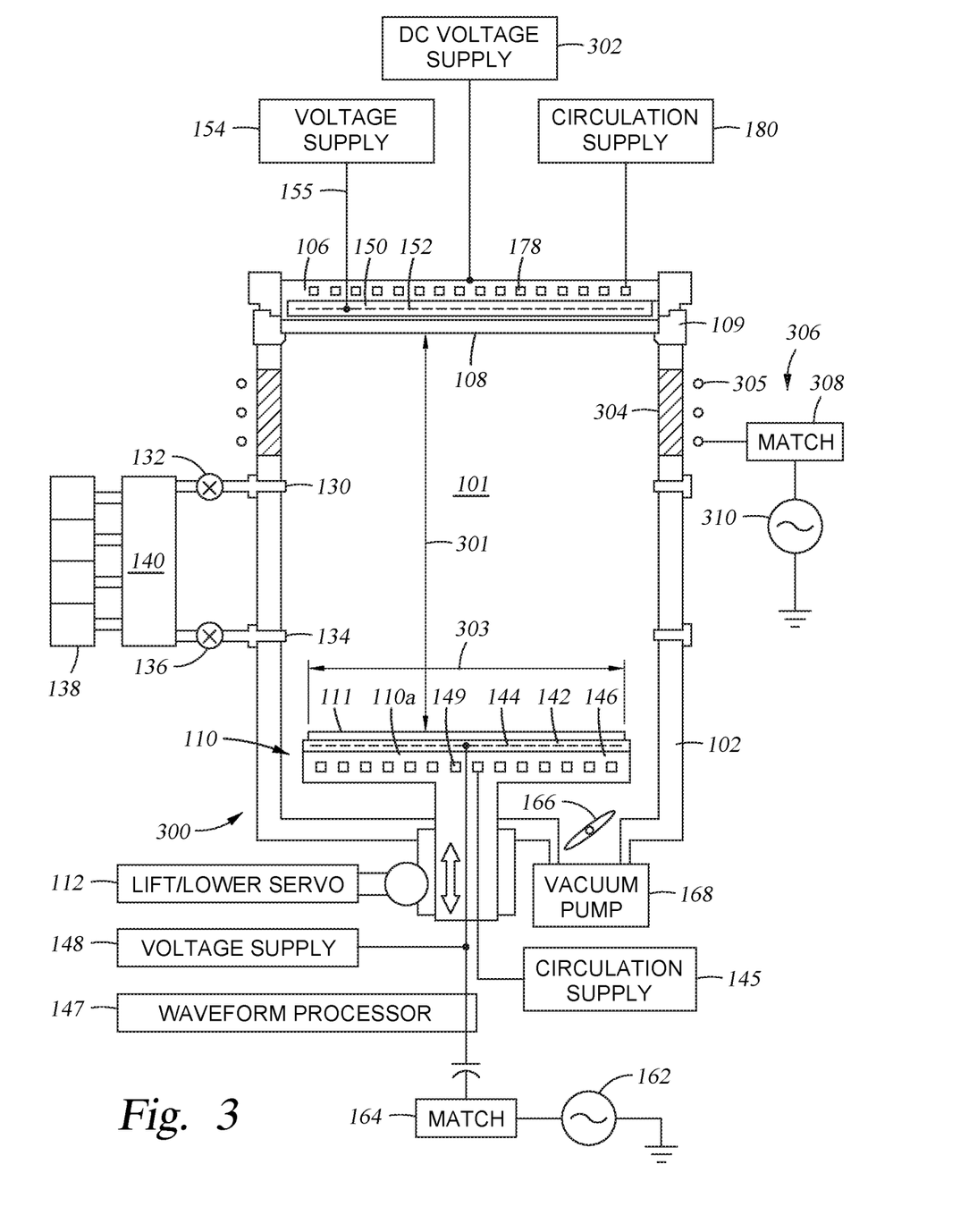
FIG. 3 schematically illustrates another example of an electron beam reactive etching apparatus according to an embodiment described herein.

FIG. 3 depicts yet another example of an electron beam etching chamber 300. The electron beam etching chamber 300 is similar to the chambers 100, 200 depicted above, but without the RF power generator 120, 122 located above the chamber 300. A DC power generator 302, similar to the DC voltage generator 202, is coupled to the processing chamber 300. A coil assembly 306 is disposed adjacent to the chamber 300. The coil assembly 306 includes an inductive coil antenna 305 driven by an RF power generator 310 through an impedance match 308. The inductive coil antenna 305, impedance match 308 and the RF power generator 310 are similar to the inductive coil antenna 182, impedance match 184 and the RF power generator 186 in FIG. 1. Similarly, a side window 304 is formed in the chamber body 102. The side window 304 is formed from a material (e.g., quartz or aluminum oxide/nitride) through which RF power may be inductively coupled. By utilizing the inductive coil antenna 305, plasma density in the process volume 101 may be substantially enhanced by the RF power from the RF power generator 310. In one example, the RF power generator 310 and the coil antenna 305 may assist the bombardment flux to sputter off materials from the electrode 108, thus generating secondary electrons to form an electron beam to the substrate 111 disposed on the pedestal 110.

The inductive coil antenna 305 generates inductive coil plasma (ICP) when a power voltage is applied through the RF power generator 310. A DC power generator 302 supplies a negative DC bias voltage to the electrode 108. Similar to the description above, the negative DC bias power from the DC power generator 302 may assist accelerating the electron beam to the substrate surface. Unlike the side window 181 located at a middle portion of the chamber 100 depicted in FIG. 1, the location of the side window 304 is located at the upper portion of the chamber 300 close to the ceiling 106. By doing so, the flux of the electron beam from the electrode 108 may be controlled a desired density by the control of the inductive coil antenna 305. In one example, the sidewall window 304 along with the coil assembly 306 are disposed in close proximate to the ceiling 106, such as about less than 10 inches from the bottom of the ceiling 106 to the top surface of the side window 304 as well as the coil assembly 306.

In this example, a distance 301 of the electrode 108 to the substrate support surface 110*a* is between about 1 inch and about 50 inches and the pedestal 110 has a width 303 between about 4 inches and about 30 inches.

Figure 4A:
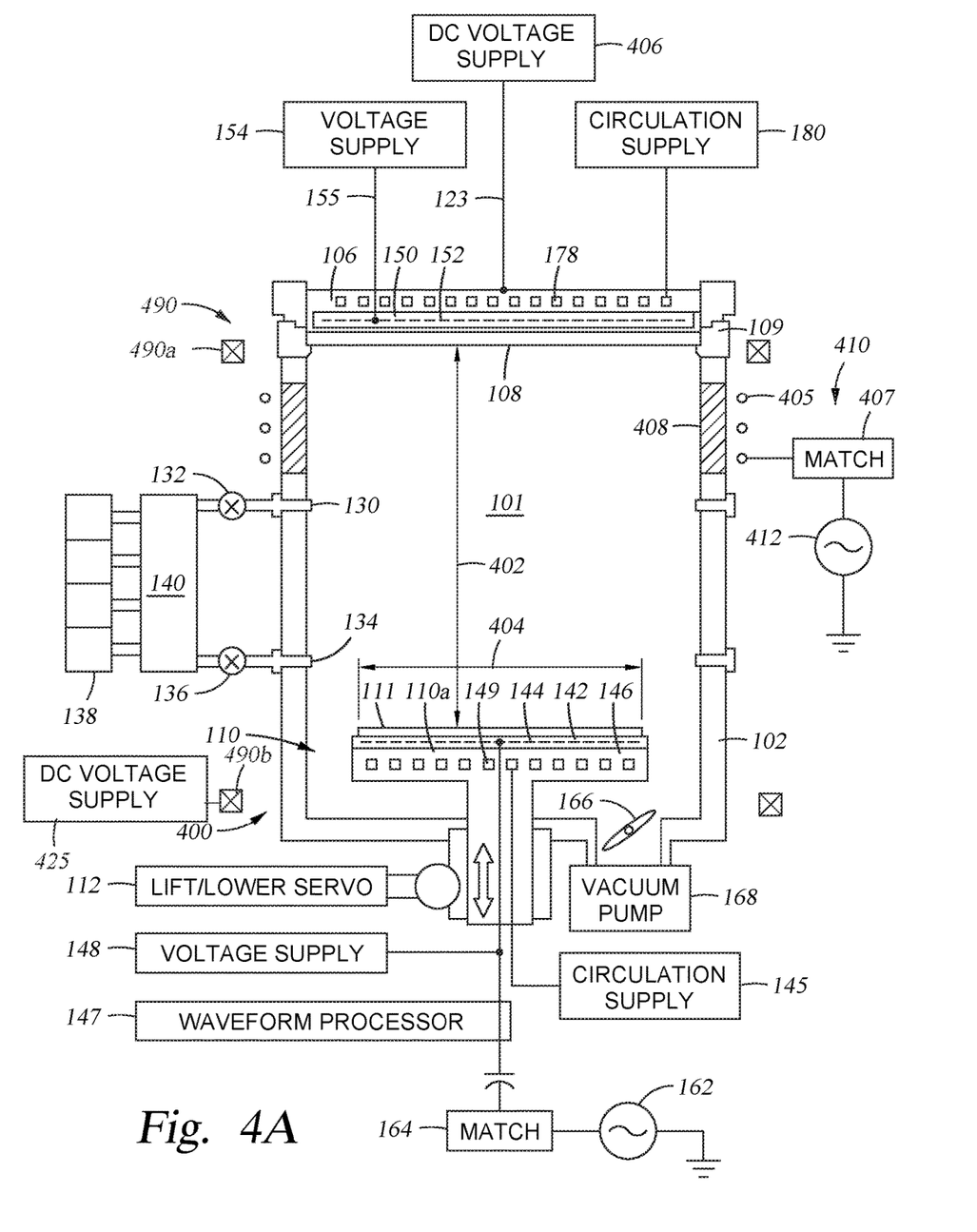
FIGS. 4A and 4B schematically illustrate another example of an electron beam reactive etching apparatus and the electron beam trajectory in the etching apparatus according to an embodiment described herein.

FIG. 4A depicts yet another example of an electron beam etching chamber 400. Similar to the chamber 300 depicted in FIG. 3, a coil assembly 410 and a DC power supply 406 is coupled to the chamber 400. In this example, a distance 402 from the electrode 108 to the substrate support surface 110*a* is relatively shorter than the distance 301 depicted in FIG. 3. In this example, the inductive coil antenna 405 in the coil assembly 410 may include a Helmholtz coil set 490 (e.g., circle or oblong shape) including a pair of coils 490*a*, 490*b* and a DC power supply 425 coupled thereto may generate horizontal magnetic field when a power is applied to the Helmholtz coil set 490. As the Helmholtz coil set 490 horizontally surrounds the chamber 400, a horizontal magnetic field may be generated while supplying a DC voltage power thereto. The electron beam generated in the chamber 400 may be deflected and/or altered by the horizontal magnetic field.

Figure 4B:
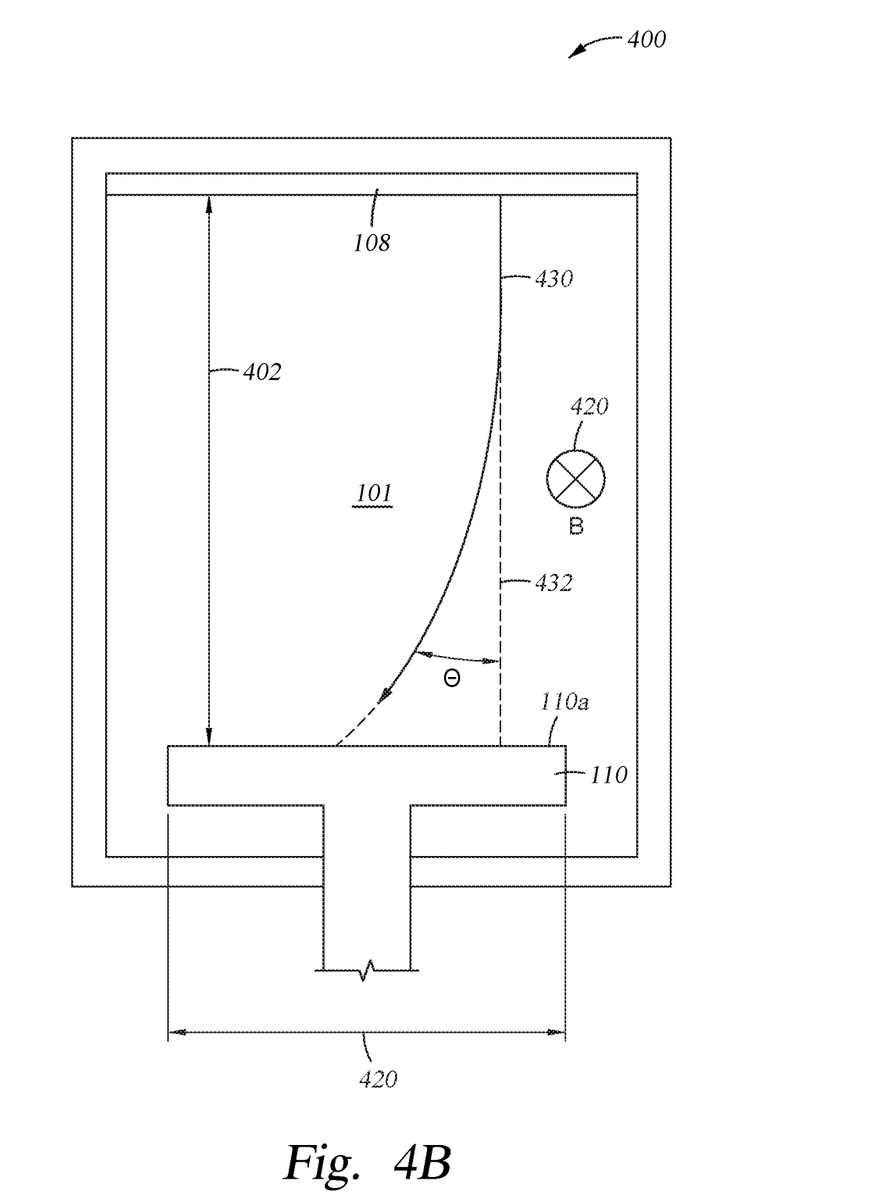

FIG. 4B depicts a schematic cross sectional view of the chamber 400 that has a magnetic field generated in the chamber when a power is supplied to the Helmholtz coil set 490. In operation, the Helmholtz coil set 490 is powered to generate a magnetic field 420, as shown in FIG. 4B. In the example depicted in FIG. 4B, the direction of the magnetic field 420 is in a horizontal direction parallel to the substrate support surface 110a. The electron bean generated in the chamber 400 can then be deflected by a Lorentz force to swirl with a certain angle Θ relative to a vertical plane 430 perpendicular to a horizontal plane defined by the substrate support surface 110a. In one example, the angle Θ is between about 0 degrees and about 90 degrees. By utilizing this feature, a directional electron beam may be obtained so as to etch a material on a substrate with certain direction with desired lateral etching.

The level of the deflected angle Θ that the electron beam is swirled depends on the magnetic field strength (B), the distance 402 (e.g., a vertical length between the substrate support surface 111a and the top electrode 108) and the electron beam energy (E). An equation below may be utilized to describe the relationship of the variable effecting the deflected angle θ of the electron beam.

$$\theta = \sin^{-1}\frac{qBh}{\sqrt{2mE}}$$

The equation includes several variables where m is the electron mass, q is electron charge, B is the magnetic field strength and h is the distance 402 defined in the chamber 400. Thus, by properly altering or adjusting the power supplied to the coil DC supply 425, the magnetic field strength B may be changed so that the angle Θ which dominates the electron beam trajectory may be changed. Further, by properly defining the distance 402 between the substrate support surface 111a and the top electrode 108, the desired range of angle Θ may also obtained. In one example, the distance 402 may be controlled at between about 1 inch and about 50 inches. Also, as the trajectory of the electron beam may be curved and swirled to be slightly inward toward a center location of the substrate support surface 110a, the distance 402 of the pedestal 110 may be reduced as needed. In one example, the distance 402 may be between about 10 percent and about 50 percent shorter than the distance 301 of the chamber 300 depicted in FIG. 3. A uniform magnetic field range provided from the Helmholtz coil set 490 may allow the chamber 400 to have the shorter distance 402. Alternatively, a Helmholtz coil set with a smaller size may be utilized to maintain utilizes of the chamber 400 with the shortly distance 402.

Figure 6A:
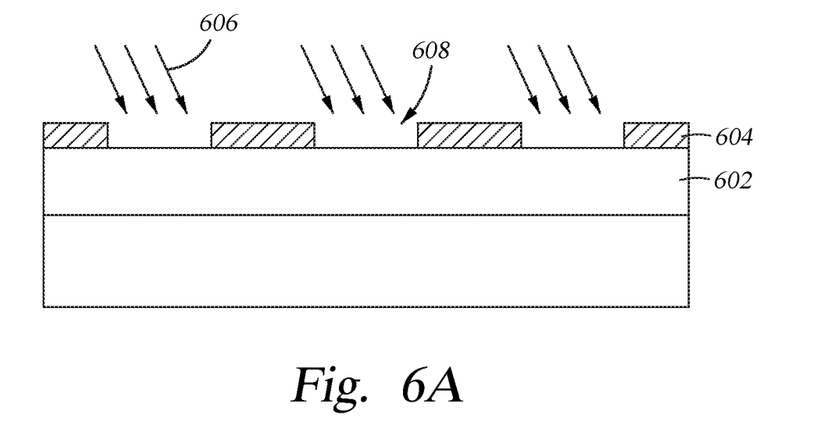
FIGS. 6A and 6B illustrate cross sectional views of a substrate at different stages of an electron beam reactive etching process using the etching apparatus according to an embodiment described herein.
Figure 6B:
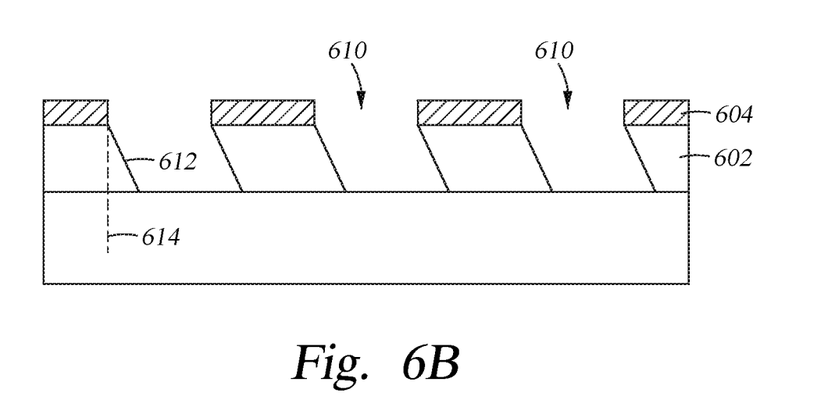

As discussed above, the directional electron beam as generated may assist laterally trimming the structures or materials disposed on the substrate 111. For example, FIG. 6A depicts the substrate 111 positioned in the chamber, such as the chamber 400. In operation, the magnetic field generated in the chamber 400 may create a magnetic force that alters the trajectory of the electron beam 606 with the predetermined angle Θ. As a result, the electron beam 606 may etch the material layer 602 disposed on the substrate 111 exposed by the openings 608 defined by the patterned mask layer 604 with an incident or tilt angle, as shown in FIG. 6A. After a predetermined period of the processing time, a feature 610 with a sloped sidewall 612 may be formed in the material layer 602, as shown in FIG. 6B. The sloped sidewall 612 may have a desired angle relative to a vertical plane 614. In one example, the angle is between about 10 degrees and about 60 degrees relative to the vertical plane 614. It is noted that the directional electron beam may be utilized to create the sloped sidewall 612 in the material layer 602. Alternatively, the directional electron beam may be utilized to trim and reduce the dimension of the mask layer 604 as needed.

Figure 7:
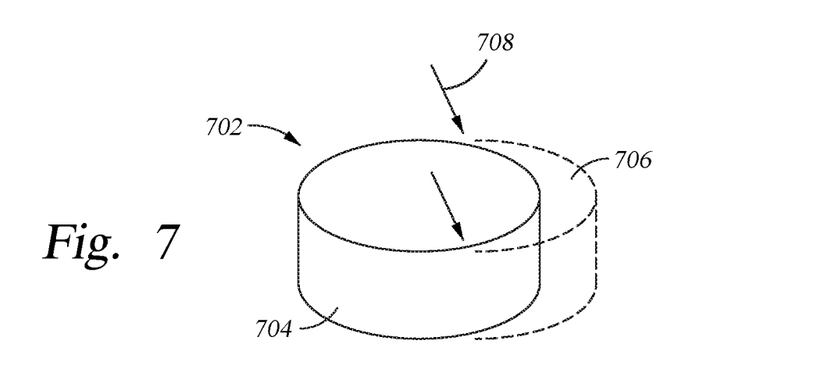
FIG. 7 illustrates a top view of a substrate after an electron beam reactive etching process is performed using the etching apparatus according to an embodiment described herein.

FIG. 7 depicts another example where the directional etching process may be utilized. The directional etching process utilizes the directional electron beam 708 having a desired tilt angle to focus the directional electron beam 708 on an edge portion 706 of a structure 702. The directional etching process continues to perform until the desired dimension of the edge portion 706 of the structure 702 is removed, leaving the desired portion 704 of the structure 702 with the desired dimension and profile.

Figure 8:
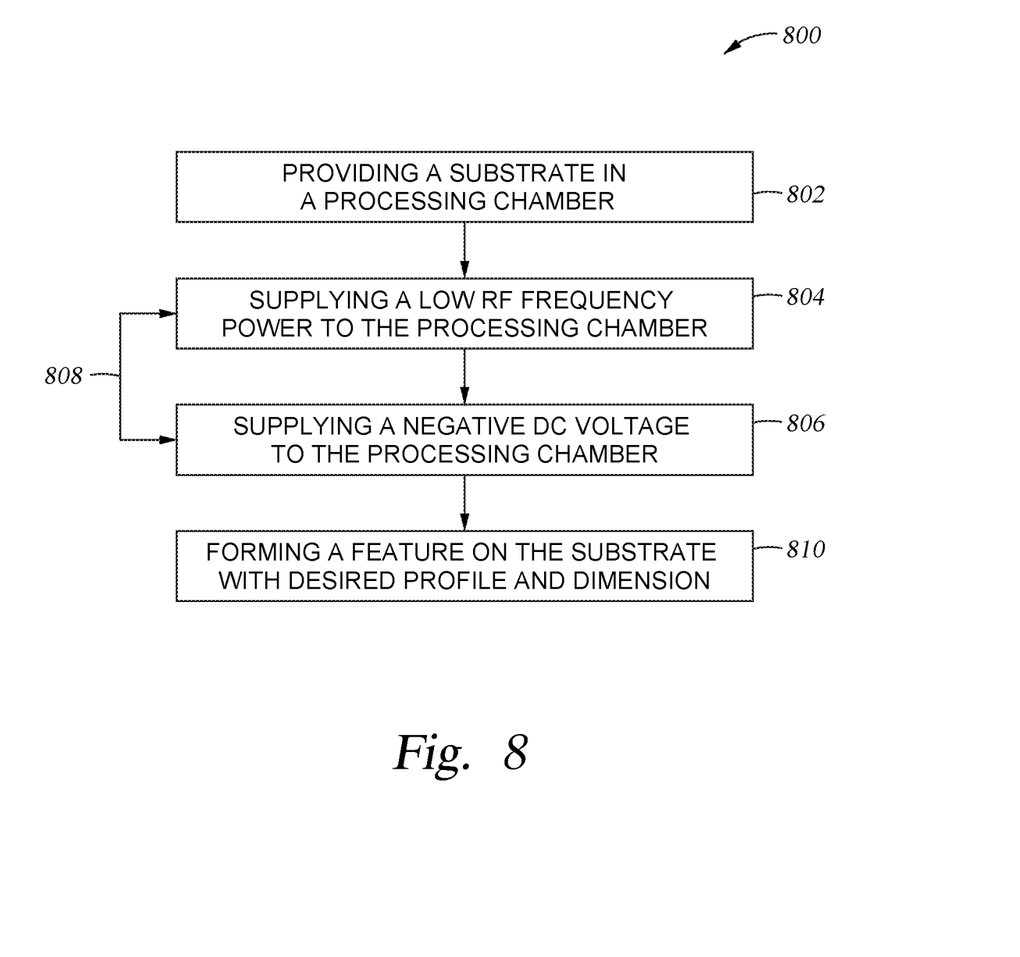
FIG. 8 illustrates a process for performing an electron beam reactive etching process according to an embodiment described herein.

FIG. 8 depicts a process 800 for performing an electron beam etching process utilizing in any one of the chambers 100, 200, 300, 400 depicted in FIGS. 1-4B. In one specific example described herein, the process 800 may utilize the chamber 200 depicted in FIG. 2. FIG. 8 starts at operation 802 by providing a substrate, such as the substrate 111 in the processing chamber 200. After the substrate 111 is positioned in the chamber 200, an etching gas mixture is supplied to the chamber 200. Various process gases, such as halogen containing gases or oxygen containing gases, are delivered to the process volume 101 through the gas injectors 130, 134 from the supplies 138. In one embodiment, an inert gas is also delivered to the process volume 101. In this embodiment, the inert gas is delivered through the upper gas injectors 130. Although not illustrated with regard to FIG. 1, in another embodiment, the inert gas is delivered through the top electrode 108. By injecting an inert gas, it is possible to reduce the probability of reactive species back diffusion and better maintain an integrity of a plasma formed in the process volume.

In one example, the etching gas mixture may include a reacting gas and an optional inert gas. The reacting gas may include a halogen containing gas, such as $Cl_2$, $CF_4$, $CH_2F_2$, $NF_3$, HCl, HBr, $SF_6$ and the like. Suitable example of the inert gas includes Ar or He. The etching gas mixture supplied to the substrate surface in the chamber 200 may assist absorption of the etchants absorbed onto the substrate surface and distributed across the substrate surface as well as in the chamber.

At operation 804, a RF power is supplied from the RF power generators 120, 122, particularly the RF generator 122 with low frequency less than 60 MHz so as to ignite the top electrode 108 for plasma. In one embodiment, RF power having a frequency of about 2 MHz or about 13.56 MHz is applied to the top electrode 108. The low frequency RF power is applied so as to obtain a high sheath voltage. As a result, ion can be accelerated toward the top electrode 108, bombarding the surface of the top electrode 108 for secondary electron emission. In another embodiment, the low frequency RF power may be optionally applied to the pedestal 110 as needed.

After the RF power is supplied from the RF power generators 120, 122, the electrode 108 is bombarded with ions from the plasma. In this embodiment, the plasma has a predominantly positive charge and the top electrode 108 has a predominantly negative charge. Ions from the plasma are influenced by an electric field generated in the process volume 101 and the ions which are accelerated toward the top electrode 108 and thus heat the top electrode 108. Because the top electrode 108 is formed from a material having a high secondary electron emission coefficient, the ion bombardment of the top electrode 108 causes electrons to be emitted from the top electrode 108.

At operation 806, after the plasma is generated and the top electrode 108 is bombarded to generate the secondary electrons, a negative DC power is applied through the DC voltage generator 202 to enhance the momentum of the secondary electrons, accelerating the electrons toward the surface of the substrate 111. Due the substantially negative charge of the top electrode 108, the negatively charged electrons are repelled by the top electrode 108 and toward the substrate 111. Furthermore, when applying a negative voltage to the top electrode 108, the energy or momentum of the secondary electrons as generated is further enhanced and increased, thus increasing the energy of electron beam. In addition to the energy added to the electron beam, the negative voltage supplied through the DC voltage generator 202 also increases the bombardment from the plasma generated by the RF power generator 120, 122. The increased bombardment also further enhances the emission of the secondary electrons. It is also contemplated that the plasma sheath voltage potential further functions to accelerate the electrons toward the substrate 111. As the electrons are accelerated by the plasma sheath voltage, the electrons acquire energy of between about 100 electron volts (eV) and about 10,000 eV upon entry into the plasma. The electrons emitted from the top electrode 108 generate a large area secondary electron beam. The electron beam has an energy distribution which is substantially uniform across a diameter of the substrate 111. Thus, by adding the negative DC bias power to the top electrode 108, the electron beam energy can be enhanced which results in an increased etch rate resulted from an increase DC negative voltage.

It is noted that the plasma generated from the RF power generators 120, 122 at operation 804 and the negative DC power applied at operation 806 may alternately be operated intermittently, such as in alternating pulse mode, so that mono-energetic electron beams may be generated while avoiding RF modulation. As shown in the example in FIG. 5 described above, the RF power from the RF power generator 120, 122, indicated by the trace line 502 and the negative DC bias power generated from the DC voltage generator 202, indicated by the trace line 504, is alternatively pulsed so as to sequentially generate the electron beam a and enhancing the energy comprising the electron beam as needed. In one example, a DC negative voltage of between about the 1 kV and about 10 kV is applied to the top electrode 108.

Furthermore, with the negative DC power supplied at operation 806, in some examples, the frequency of the RF source power applied to the top electrode 108 could be extended to high frequency or very high frequency bands, such as 60 MHz, 120 MHz or 162 MHz, as needed.

At operation 810, as the electron beam continues to generate and accelerate toward the substrate surface, the etching process continues to perform on the substrate surface, until a desired feature with desired profile and dimension is formed. If a directional etching process is performed, a magnetic power may be applied, using the chamber 300, 400 depicted in FIG. 3-4B, to provide the electron beam with a desired incident angle relative to the substrate surface, thus forming the features on the substrate surface.

It is noted that the operation 804 and 806 can be repeatedly performed, as indicated by the loop 808, until a desired feature with desired profile is obtained in the substrate at operation 810.

By utilizing electron beams generated in accordance with the embodiments described above, reactive species which are not readily obtained with conventional etching processes may be generated. For example, reactive species with high ionization and/or excitation/dissociation energies may be obtained with the electron beam etching methods and apparatus described herein. It is also believed that the electron beam etching methods described herein provide for etching rates equivalent to or greater than conventional etching processes, but with improved material selectivity.

For example, electron beam etching methods are believed to provide improved etch selectivity due to the separation of threshold electron beam energies used to induce etching reactions. For example, with certain polymerizing gas chemistries, the threshold energy utilized to etch silicon oxide materials is much greater than the threshold energy utilized to etch silicon. As a result, an etch selectivities of about 5:1 or greater may be achieved. In one embodiment, electron beam etching methods enable selectivity of about 5:1 silicon:silicon oxide. In another embodiment, electron beam etching methods enable etch selectivity of about 5:1 tungsten:silicon nitride etch selectivity. Furthermore, the directional electron beam etching process may also enable the electron beam directed to the substrate with a desired incident angle, so as to laterally etch the substrate, forming a sloped sidewall or other desired features in the substrate as needed.

The kinetic energy of the electron beam is also less than that of a beam comprised predominately of ions. As a result, substrate damage is reduced because the potential for sputtering of the substrate material is reduced. With improved control, electron beam etching process is able to produce tapered feature profiles, such as sloped sidewall profiles, to meet different device requirements as needed.

While the foregoing is directed to embodiments of the present disclosure, other and further embodiments of the disclosure may be devised without departing from the basic scope thereof, and the scope thereof is determined by the claims that follow.

What is claimed is:

1. A method of etching a substrate, comprising:
    delivering a process gas to a process volume of a process chamber;
    applying a RF power to an electrode disposed in the process volume, the electrode material selected from the group consisting of silicon, carbon, silicon carbon materials, and silicon-oxide materials;
    generating a plasma comprising ions in the process volume;
    bombarding the electrode with the ions to cause the electrode to emit electrons and form an electron beam;
    applying a negative DC power to the electrode;
    accelerating electrons emitted from the bombarded electrode toward a substrate disposed in the process chamber; and
    magnetically steering the accelerated electrons to directionally etch the substrate.

2. The method of claim 1, wherein the RF power has a low frequency of about 2 MHz.

3. The method of claim 1, wherein the RF power has a high frequency of about greater than 60 MHz.

4. The method of claim 1, wherein accelerating the electrons emitted from the electrode comprises:
    generating a magnetic field in the process volume of the process chamber.

5. The method of claim 4 further comprising:
    altering a trajectory of the electrons in the process volume.

6. The method of claim 1, wherein applying the RF power to the electrode and applying the negative DC power to the electrode are performed sequentially.

7. The method of claim 1, wherein the RF power is applied in a pulsed mode.

8. The method of claim 1, wherein the DC power is applied in a pulsed mode.

9. The method of claim 1, wherein the process gas comprises a halogen containing gas.

10. The method of claim 1, wherein the electrode includes materials selected from silicon, carbon, silicon carbon materials, or silicon-oxide materials.

11. The method of claim 1, wherein the plasma is generating by capacitive coupling.

12. The method of claim 1, wherein the plasma is generating by inductive coupling.

13. The method of claim 1, wherein the electron beam has a beam energy between about 10 eV to 20,000 eV.

14. A method of etching a substrate, comprising:
   delivering a process gas to a process volume of a process chamber;
   applying a RF power to an electrode disposed in the process volume, the electrode material selected from the group consisting of silicon, carbon, silicon carbon materials, and silicon-oxide materials;
   generating a plasma comprising ions in the process volume;
   bombarding the electrode with the ions to cause the electrode to emit electrons and form an electron beam;
   generating a magnetic field in the process volume of the process chamber;
   altering a trajectory of the electrons in the process volume with the magnetic field; and
   etching a substrate with the electrons at an incident angle relative to a horizontal surface of the substrate.

15. The method of claim 14, wherein the electrode is formed from one or more of a silicon material, a carbon material, silicon carbon materials, silicon-oxide materials, an aluminum oxide material, a yttrium oxide material and a zirconium oxide material.

* * * * *